United States Patent [19]

Biddlecombe et al.

[11] Patent Number: 4,591,722
[45] Date of Patent: May 27, 1986

[54] LOW TEMPERATURE STAGE FOR MICROANALYSIS

[75] Inventors: William H. Biddlecombe, Ralston; Hugh Y. Elder; W. A. Patrick Nicholson, both of Glasgow, all of United Kingdom

[73] Assignee: The University Court of the University of Glasgow, Scotland

[21] Appl. No.: 568,207

[22] PCT Filed: Apr. 19, 1983

[86] PCT No.: PCT/GB83/00115
§ 371 Date: Dec. 19, 1983
§ 102(e) Date: Dec. 19, 1983

[87] PCT Pub. No.: WO83/03707
PCT Pub. Date: Oct. 27, 1983

[30] Foreign Application Priority Data

Apr. 20, 1982 [GB] United Kingdom ............ 8211341

[51] Int. Cl.[4] ........................................ H01J 37/20
[52] U.S. Cl. .......................................... 250/443.1
[58] Field of Search ........................ 250/443.1, 311

[56] References Cited

U.S. PATENT DOCUMENTS 3,958,124 5/1976 Koch et al. .................. 250/442
4,162,401 7/1979 King et al. .................. 250/311

FOREIGN PATENT DOCUMENTS 2000901 1/1979 United Kingdom .

OTHER PUBLICATIONS

Eades, "A Helium-Cooled Specimen Stage . . . ", J. Phys. E. Sci. Instrum., vol. 15, 1982, pp. 184–186.
Pross et al, "Transportable Cryostat . . . ", Rev. Sci. Instrum., vol. 47, No. 3, Mar. 1976, pp. 353–355.

Primary Examiner—Alfred E. Smith
Assistant Examiner—Jack I. Berman
Attorney, Agent, or Firm—Gerald J. Ferguson, Jr.

[57] ABSTRACT

A low-temperature stage for use in an electron microscope comprises a main body (37), a holder (10) for a specimen mount, a heat exchanger (16) within the main body (37), conduit means (14, 18) for supplying coolant to the heat exchanger, a bar (22) of relatively large cross-section and relatively high thermal conductivity interconnecting the heat exchanger (16) and the specimen mount holder (10) to form a heat transfer path therebetween, and a support member (28) of relatively small cross-section and relatively low thermal conductivity interconnecting the specimen mount holder (10) and the main body (37), the support member (28) being a generally box-shaped member (28) disposed around said bar. An anti-contaminator for an electron microscope, comprising a metallic cryogenic shield (58), a tank (50) for holding a cryogenic liquid maintained at boiling point, and a thermal pathway (60) between the shield (58) and the tank (50).

7 Claims, 6 Drawing Figures

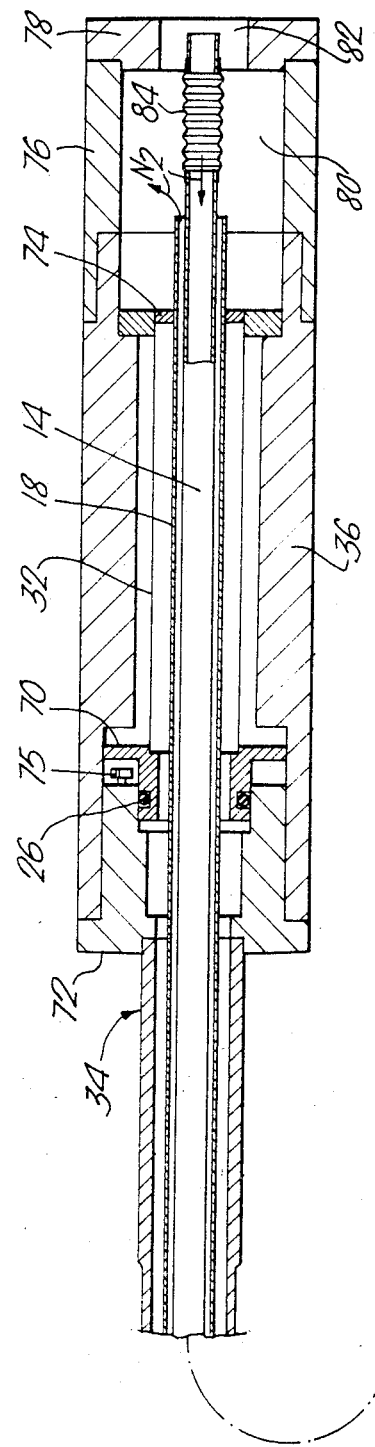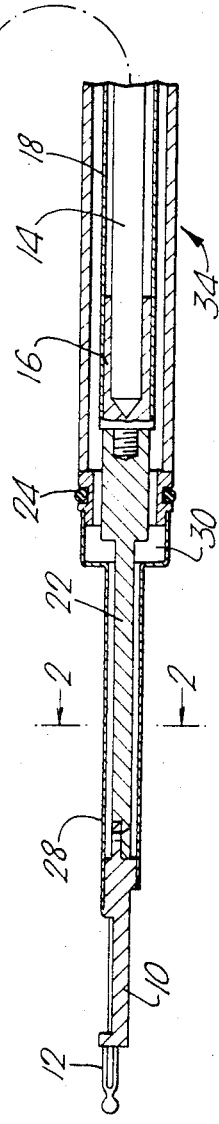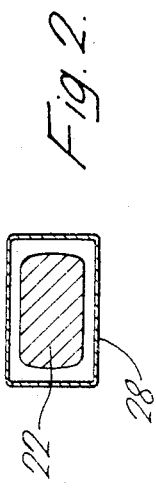

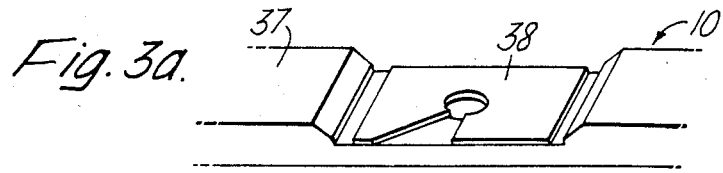
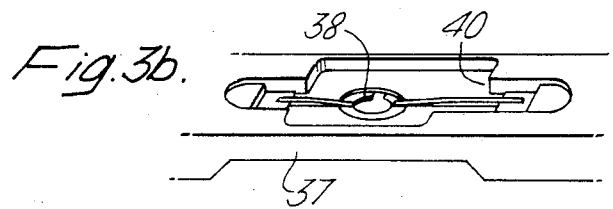
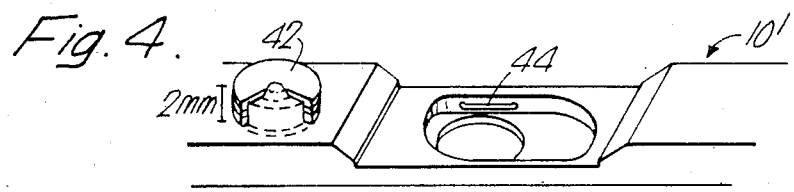
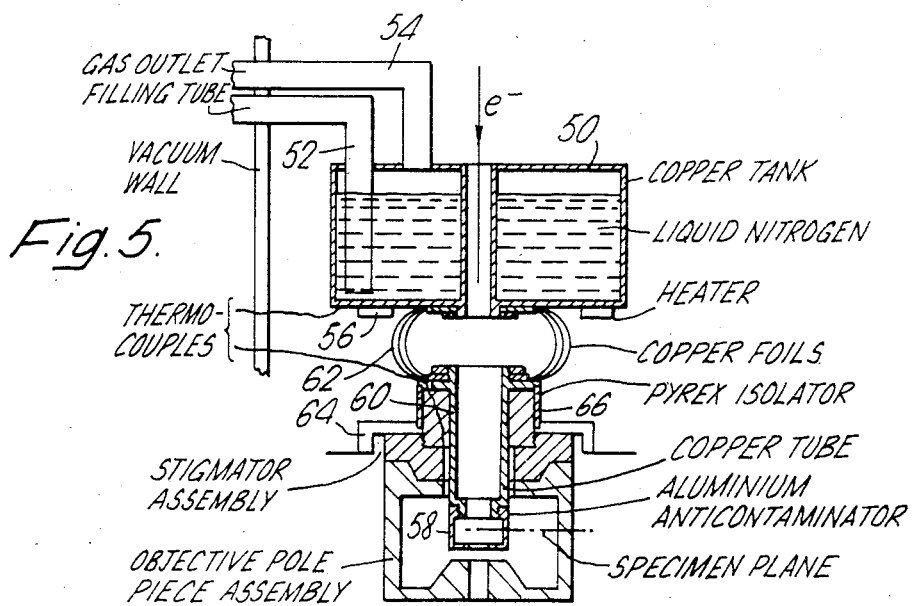

LOW TEMPERATURE STAGE FOR MICROANALYSIS

This invention relates to a low temperature specimen stage for use in microanalysis, primarily in the microanalysis of thin specimens in a transmission electron microscope by X-ray spectrum examination.

In analysing biological specimens by X-ray analysis in the TEM, it is necessary to prepare the specimens at cryogenic temperatures, and to maintain the specimens at such temperatures during analysis, in order to prevent movement of soluble and unfixed ions. This presents problems in design of the specimen stage, since it must hold the specimen at a cryogenic temperature, and yet present elastomeric seals at approximately room temperature to accommodate movement in a goniometer mounting. At the same time, the stage must be mechanically stiff to give accurate and constant positioning of the specimen in the electron beam.

An object of the present invention is to overcome or mitigate these problems.

According to the invention a low-temperature stage for use in an electron microscope comprises a main body, a holder for a specimen mount, a heat exchanger within the main body, conduit means for supplying coolant to the heat exchanger, a bar of relatively large cross-section and relatively high thermal conductivity interconnecting the heat exchanger and the specimen mount holder to form a heat transfer path therebetween, and a support member of relatively small cross-section and relatively low thermal conductivity interconnecting the specimen mount holder and the main body, the support member being a generally box-shaped member disposed around said bar.

Preferably the bar is of copper and the support member of stainless steel sheet.

In a preferred form, a forward O-ring seal is disposed around the stage between the support member and the body, a rear O-ring seal is provided to form a vacuum seal for the interior of the body, and the rear O-ring seal is connected to the conduit means by a tubular member of thin sheet material acting as a thermal isolator.

From another aspect, the invention provides an anticontaminator for an electron microscope, comprising a metallic cryogenic shield, a tank for holding a cryogenic liquid maintained at boiling point, and a thermal pathway between the shield and the tank.

Preferably, said thermal pathway includes flexible metal foil.

An embodiment of the present invention will now be described, by way of example, with reference to the accompanying drawings, in which:

FIG. 1 is a cross-sectional side view of a specimen stage in accordance with the invention;

FIG. 2 is a cross-section to an enlarged scale on the line 2—2 of FIG. 1;

FIG. 3a is a perspective view from above of a specimen mount holder used in the embodiment of FIG. 1;

FIG. 3b is a perspective view from below of the same mount holder;

FIG. 4 is a perspective view from above of an alternative specimen mount holder; and FIG. 5 is a diagrammatic cross-sectional side view of an anticontaminator.

Referring to FIG. 1, the stage has a specimen mount holder 10 at one end. A bearing 12 is formed from fused silica tubing to give a spherical surface which seats in a conical mount (not shown) of the TEM. Nitrogen gas at approximately −190° C. is supplied through an inner tube 14 to a copper heat exchanger 16 and exhausts via a concentric outer tube 18. A thermocouple (not shown) is provided to monitor the temperature of the heat exchanger 16. The heat exchanger 16 is thermally coupled to the specimen mount holder 10 by a copper bar 22 of relatively massive cross-section. A further thermocouple (not shown) monitors the temperatures at the specimen mount itself.

Vacuum sealing of the stage in the TEM is provided by a forward O-ring 24 and a rear O-ring 26. The forward 0-ring 24 also accommodates movement of the stage in the goniometer mounting. These O-rings must be maintained at approximately room temperature to retain their resilience and thus their sealing properties. To this end, the forward O-ring is thermally separated from the specimen area by a thin stainless steel member 28 which forms a box-section around the copper bar 22 and thus also acts as a mechanical stiffening member. It will be appreciated that the intervening space 30 between the bar 22 and the isolator member 28 is at vacuum.

Similarly, the rear O-ring 26 is thermally isolated from the nitrogen tubes 14,18 by a cylindrical member 32 of thin stainless steel, which also acts as a mechanical reinforcement.

The isolator member 28 is secured to a tubular copper body 34.

The rear O-ring 26 is carried by a brass ring 70 to which the front of the isolator member 32 is secured. The O-ring 26 is slidable on the inner face of a brass body 72 to accommodate thermally induced movement. The rear of the isolator member 32 is secured to a brass ring 74 seated on the tube 18. Three equispaced screws, one of which is seen at 75, can be adjusted to act as stops for the sliding movement.

A plastics cover 36,76,78 forms a cavity 80 into which the nitrogen from the outer tube 18 passes, the nitrogen then escaping via aperture 82. The cavity 80 is thus maintained cold and dry, preventing heat absorption and frost formation, particularly on a flexible connector for the gas supply in the form of a thin-walled nickel bellows 84. A neoprene washer 86 limits forward movement of nitrogen from the cavity 80.

It has been found that with this arrangement the specimen can be held at a temperature in the range −80° to −180° C. without degrading the O-rings.

The specimen mount holder 10 is shown in greater detail in FIG. 3. The main body 37 is of copper. The specimen is mounted on a standard 3 mm grid or single hole mount (not shown). The mount is held beneath a thin (about 100 μm thick) metal plate 38 which is usually aluminium. This ensures that there is as little solid material as possible above the specimen, which minimizes shadowing in the direction of the X-ray detector. The solid part of the mount holder 10 beneath the specimen is also cut away at 40 to minimize the amount of metal which may be struck by electrons scattered by the specimen. This mount holder is discussed in greater detail in *J. Microscopy*, Vol. 125, Pt. 1, January 1982, pp 25-40.

FIG. 4 shows an alternative form of specimen mount 42 and holder 10'. The holder 10' is of copper. The mount 42 has a depending cylindrical side wall which is grooved to cooperate with a spring clip 44. The mount 42 is of aluminium or copper and is much more massive than conventional specimen mounts. Consequently, the thermal capacity is high and it is easier to obtain good thermal contact with the holder 10'. Also, because the mount is loaded from above, there are no parts above the specimen within 10 mm, which improves the geometry for X-ray analysis. The specimen support film is stretched directly over the central hole, which is suitably 0.8 mm diameter.

The specimen stage of the invention is preferably used in conjunction with the anticontaminator illustrated in FIG. 5. This makes use of a closed tank 50 of liquid nitrogen within the TEM. Liquid nitrogen is introduced via a tube 52 and gaseous nitrogen is vented via a tube 54. An aluminium anticontaminator shield 58 is thermally coupled to the tank 50 via a copper tube 60 and flexible copper foils 62. The shield 58 and tube 60 are thermally insulated from, and mechanically supported by, the lens mounting 64 by means of a borosilicate glass tube 66. The anticontaminator can thus be maintained at a lower temperature than the sample and surrounding parts, and act as a trap for contaminants. A heater 56 is provided on the tank 50 for removing nitrogen when bringing the equipment to room temperature.

We claim:

1. A low-temperature stage for use in an electron microscope, comprising a main body, a holder adapted to hold a specimen mount stationary with respect to the main body, a heat exchanger within the main body, conduit means for supplying coolant to the heat exchanger, a bar of relatively large cross-section and relatively high thermal conductivity interconnecting the heat exchanger and the specimen mount holder to form a heat transfer path therebetween, a support member of relatively small cross-section and relatively low thermal conductivity interconnecting the main body and the specimen mount holder, the support member being a hollow member disposed around said bar, and sealing means disposed on the exterior of the main body for cooperation with an electron microscope to permit rotation and translation of the stage within the microscope, the sealing means being adjacent the support member whereby the latter acts also as a thermal isolator between the sealing means and the cryogenic parts.

2. The stage claimed in claim 1 wherein the bar is of copper and the support member of stainless steel sheet.

3. The stage claimed in claim 1 or claim 2 wherein said sealing means comprises an O-ring seal, and wherein a rear O-ring seal is provided to form a vacuum seal for the interior of the body, the rear O-ring seal being connected to the conduit means by a tubular member of thin sheet material acting as a thermal isolator.

4. A low-temperature stage according to claim 1, for use in X-ray emission microanalysis, in which the specimen mount holder has a cut-away portion under the specimen location to minimize material within range of electrons scattered by the specimen.

5. An anticontaminator for use in an electron microscope, comprising a metallic cryogenic shield disposed around the sample plane of the microscope, a tank for holding a cryogenic liquid maintained at boiling point, the tank being positioned in use within the vacuum enclosure of the microscope adjacent to the specimen plane between the latter and the electron source, and a thermal pathway between the shield and the tank.

6. The anticontaminator of claim 5 wherein said thermal pathway includes flexible metal foil.

7. The anticontaminator of claim 5 or claim 6, in which said tank has a through passage via which the electron beam travels to the specimen plane.

* * * * *